United States Patent
Harris et al.

(10) Patent No.: US 10,291,017 B2
(45) Date of Patent: May 14, 2019

(54) ELECTRICAL PROTECTION DEVICE AND A METHOD OF PROVIDING ELECTRICAL PROTECTION

(71) Applicant: IEP2 RESEARCH PTY LIMITED, New Castle, New South Wales (AU)

(72) Inventors: Richard Harris, Queensland (AU); Geoffrey Rubython, Mayfield (AU)

(73) Assignee: IEP2 RESEARCH PTY LIMITED, New Castle, New South (AU)

(*) Notice: Subject to any disclaimer, the term of this patent is extended or adjusted under 35 U.S.C. 154(b) by 502 days.

(21) Appl. No.: 14/896,278

(22) PCT Filed: Jun. 10, 2014

(86) PCT No.: PCT/AU2014/000602
§ 371 (c)(1),
(2) Date: Dec. 4, 2015

(87) PCT Pub. No.: WO2014/194375
PCT Pub. Date: Dec. 11, 2014

(65) Prior Publication Data
US 2016/0134105 A1   May 12, 2016

(30) Foreign Application Priority Data
Jun. 7, 2013 (AU) ................. 2013902066

(51) Int. Cl.
*H02H 3/14* (2006.01)
*H02H 3/16* (2006.01)
(Continued)

(52) U.S. Cl.
CPC ............ *H02H 9/04* (2013.01); *G01R 31/025* (2013.01); *H02H 3/14* (2013.01); *H02H 3/16* (2013.01); *H02H 3/33* (2013.01)

(58) Field of Classification Search
CPC ... H02H 9/04; H02H 3/33; H02H 3/16; G01R 31/025
(Continued)

(56) References Cited

U.S. PATENT DOCUMENTS

| 4,347,540 A | 8/1982 | Gary et al. |
| 8,278,934 B2 | 10/2012 | Wang |

(Continued)

FOREIGN PATENT DOCUMENTS

| AU | 2013100479 A4 | 5/2013 |
| CN | 102185276 A | 9/2011 |

(Continued)

OTHER PUBLICATIONS

Gato, AU0201300479; Drawings and Specifications.*
(Continued)

*Primary Examiner* — Dharti H Patel
(74) *Attorney, Agent, or Firm* — MH2 Technology Law Group LLP

(57) ABSTRACT

There is provided an integration of the leakage current functions of an RCD and the voltage sensing functions of other prior art protection devices. By integrating the two capabilities into one decision making system/algorithm, and considering the circuits performance in terms of leakage current as it correlated with elevated protective earth voltages (and vice versa), an embodiment is created which is able to "look into" a protected electrical system and make much more precise and discerning decisions on electrical status and probability of unsafe events. The resultant technology attends to the outstanding issues with the prior art technologies as they stand, and provides a protection solution that covers the entire range of electrical power wiring configurations and the practical complexities of modern electrical works.

16 Claims, 5 Drawing Sheets

(51) Int. Cl.
  *H02H 3/33*   (2006.01)
  *H02H 9/04*   (2006.01)
  *G01R 31/02*  (2006.01)

(58) Field of Classification Search
  USPC .................................................. 361/42–49
  See application file for complete search history.

(56) References Cited

U.S. PATENT DOCUMENTS

| | | | | |
|---|---|---|---|---|
| 2006/0227472 | A1* | 10/2006 | Taylor | H02H 3/04 |
| | | | | 361/42 |
| 2010/0046129 | A1* | 2/2010 | Mikrut | H02H 9/005 |
| | | | | 361/45 |
| 2017/0138991 | A1* | 5/2017 | Curtis | H01H 47/00 |

FOREIGN PATENT DOCUMENTS

| | | | |
|---|---|---|---|
| CN | 102439811 | A | 5/2012 |
| EP | 1056179 | A2 | 11/2000 |
| FR | 2444359 | | 11/2000 |

OTHER PUBLICATIONS

Louis, FR-2444359; Drawings and Specifications.*
EP Examiner Antoniy Trifonov, "Supplementary European Search Report and European Search Opinion" dated May 18, 2016 in corresponding EP Application No. 14807143, 7 pages.
International Search Report dated Sep. 12, 2014 from International Application No. PCT/AU2014/000602 filed Jun. 10, 2014, pp. 1-4.
Australian Examination Report dated Jun. 30, 2017 in corresponding Australian Application No. 2014277630.

* cited by examiner

ELECTRICAL PROTECTION DEVICE AND A METHOD OF PROVIDING ELECTRICAL PROTECTION

CROSS-REFERENCE TO RELATED APPLICATIONS

This application is a U.S. National Stage application of PCT/AU2014/000602 filed 10 Jun. 2014, which claims priority to Australian Application No. 2013902066 filed 7 Jun. 2013, the entire disclosures of which are hereby incorporated by reference in their entireties.

FIELD OF THE INVENTION

The present invention relates to an electrical protection device and a method of providing electrical protection.

Embodiments of the invention have been particularly developed as residual current devices (RCDs) for use in mains power distribution and will be described herein with particular reference to that application. However, it will be appreciated that the invention is not limited to such a field of use, and is applicable in broader contexts.

BACKGROUND

Any discussion of the background art throughout the specification should in no way be considered as an admission that such art is widely known or forms part of common general knowledge in the field.

RCD protection technology was invented around the 1960's to provide a tertiary level of electrical protection against electrocution. RCD technology reacts to leakage of current from an electrical circuit to implement a protective function should that leakage current exceeds a level that is deemed to be likely to cause harm to humans.

Considerable work has been conducted over the decades as to what level of leakage current is reasonable to ensure adequate safety. Generally at power frequencies a maximum of 30 mA is considered the accepted limit. In certain applications this can reduce to 5 mA or increase to as much as 100 mA.

Over the last two decades or so electrical circuit current leakage or RCD technologies (referred within as current leakage) have progressively become widespread in domestic and industrial applications especially in the developed world. This is due to their inclusion in many national safety standards. However at the same time many deficiencies in the technology have become apparent. In particular it is being increasingly recognised that there are many circumstances where an RCD will not provide adequate protection, or where it will be susceptible to false triggers.

In the decade leading up to 2010 there were a number of technologies developed in an attempt to address one or more of these deficiencies. One earlier proposed technology sensed the voltage of the protective metal work of an appliance (irrespective of whether that metal work was connected effectively to local or remote ground). The technology, which will be referred to as voltage sensing technology, instituted a protective function if the voltage of the protective metal work moved away from supply neutral in a way that could potentially expose a human to harm through an electric shock. This technology provides protection against faults in systems where ground return paths are insufficient (too high resistance) to allow sufficient leakage current to trip the RCD technology. However, this technology is not readily applicable to MEN systems in light of the method of operation and the difficulties in achieving compliance with the required standards for protection circuits.

Further known systems monitor current flowing from protective metal work as an alternative to (or in combination with) monitoring the voltage of the protective metal work. Such systems found in, for example, PCT publication WO/2010/069011, relates to the other techniques discussed in that: (1) such sentinel (or fault) current is leakage from the electrical circuit and therefore related to RCD technology—although it is monitored in a different circuit location; and (2) such leakage currents are as a result of the voltage potential applied to the protective metal work by an internal fault to the Active conductor and such would also be seen by voltage sensing technologies.

As with voltage sensing, current flow fault sensing relies on an electrical reference (for current flow it is a current sink and for voltage sensing it is a reference voltage level). This is theoretically different from RCD circuit current leakage technology that monitors only current leakage (in the form of active/neutral imbalance) without reference to where that current is flowing (that is, the sink for such current).

Although the above technologies have a similar protection aim of identifying faults which might cause safety hazards, they use different fault-information collection strategies based respectively on current and voltage sensing at different locations within the circuit to achieve that aim. Importantly, the strategic differences are related to voltage reference, current sink, physical location, and fault-impedance differences.

As a result there is a correlation between the fault information gathered by each technique. For example, voltage sensing and current sensing technologies differ in that current sensing is highly dependent of the impedance of the fault. A high (non-critical) fault impedance may still result in a significant voltage on the chassis. However, such a voltage may not be capable of delivering sufficient current to cause harm. With regards to leakage current technologies, they may sense no imbalance in the circuit due to fault or circuit characteristics (that is, where earthing is poor), even when a significant fault occurs. In such cases voltage sensing or current sensing technologies may clearly see a fault signal.

An important difference between these forms of protection is demonstrated on consideration of floating earth installations. Current Leakage (RCD) technology is often used for well-earthed Multiple Earth Neutral (MEN) systems (also called TN) as it responds relatively quickly to any current leakage from the circuit due to a fault to earth (the most common type of fault). However, current leakage technology requires positive and significant fault current flow before it generates any fault indication. In poorly earthed environments (such as within TT and IT systems) such current flow may not occur and therefore RCD sensing will not receive any fault information.

Similarly frame and metal work voltage and current sensing technologies provide fault sensing in floating systems by providing an independent reference to either measure the result of a fault as active voltage on the metal chassis or facilitate a small current flow to generate a fault signal. Consequently, in a well-maintained MEN (TN) system, chassis or electrical metal work sensing may not provide a reliable fault signal.

In summary, known systems and devices may be adequate for some applications. For example, RCD technologies being most applicable to well earthed MEN or TN type installations while chassis and metal work voltage and current sensing technologies are most applicable to poor or floating earth installations (TT and IT).

In a further and more recent development, use has been made of both current and voltage sensing in a single protection device. A device of this type is the subject matter of Australian provisional patent application No. 2012903629, filed on 22 Aug. 2012. This device has a capability that spans a wider range of power system configurations and levels of degradation, from earthed-neutral (TN) to floating power configurations (IT), from new installations to aging and poorly maintained installations. Each technology is anticipated as independent and separable, with each independently monitoring their respective fault signals and when either threshold is reached activating a protective function.

Notwithstanding better performance than either of the earlier technologies many practical problems remain in gaining reliable and widespread use of such devices. These problems include:
- A susceptibility to fault triggering as a result of electrical disturbances such as lighting and power line transients. These disturbances typically create earth currents through surge devices or circuit capacitances, or elevated Ground/Neutral voltages.
- A susceptibility to noise-based false triggering;
- A susceptibility to false or desensitized triggering as a result of electromagnetic coupling with adjacent circuits and other circuit effects.
- A susceptibility to false or desensitized triggering caused by third party equipment failures upsetting common earthing and bonding networks.
- A susceptibility to fault or desensitized triggering as a result of complicated earthing/bonding arrangements confusing, or cloaking the fault signal;
- High relative cost of alternative techniques.

SUMMARY OF THE INVENTION

It is an object of the present invention to overcome or ameliorate at least one of the disadvantages of the prior art, or to provide a useful alternative.

According to a first aspect of the invention there is provided an electrical protection device including:
at least two input terminals for electrically connecting respectively to an active conductor and a neutral conductor of an electrical power source that is upstream of the protection device;
at least two output terminals for electrically connecting to a load that is downstream of the protection device and which draws a load current at a load voltage;
a first sensor for providing a first signal derived from the load current;
a second sensor for providing a second signal derived from the load voltage;
a processing unit that is responsive to the first and second signals for selectively generating a fault signal; and
a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

In a preferred embodiment the load includes a chassis having a chassis voltage, and the chassis voltage is derived from the load voltage.

In a preferred embodiment the chassis has a chassis current, and the chassis current is derived from the load voltage.

In a preferred embodiment the processing unit is directly responsive to the first and second signals for selectively generating the fault signal.

In a preferred embodiment the processing unit is indirectly responsive to the first and second signals for selectively generating the fault signal.

In a preferred embodiment the processing unit is directly and indirectly responsive to the first and second signals for selectively generating the fault signal.

In a preferred embodiment the processing unit includes a processor that executes a predetermined algorithm which is responsive to the first and second signals for selectively generating the fault signal.

In a preferred embodiment the predetermined algorithm is responsive to: the first and second signals for calculating one or more secondary indication; and the one or more secondary indication for selectively generating the fault signal.

In a preferred embodiment the processing unit includes memory and the processor selectively stores data in the memory for use in later calculating one or more of the secondary indications.

In a preferred embodiment the load has a leakage current and the first signal is indicative of the leakage current.

In a preferred embodiment the load has a casing and the second signal is indicative of the voltage differential between the casing and the neutral conductor.

In a preferred embodiment the processing unit is responsive to the first signal reaching a first threshold for assessing one or more characteristics of the second signal and then selectively generating the fault signal.

In a preferred embodiment the processing unit is responsive to the second signal reaching a second threshold for assessing one or more characteristics of the first signal and then selectively generating the fault signal.

According to a second aspect of the invention there is provided a residual current device including:
at least two input terminals for electrically connecting respectively to an active conductor and a neutral conductor of an electrical power source that is upstream of the protection device;
at least two output terminals for electrically connecting to a load that is downstream of the protection device and which draws a load current at a load voltage, wherein the load has a casing;
a first sensor for providing a current signal that is indicative of a leakage current for the load;
a second sensor for providing a voltage signal which is indicative of the voltage of the casing;
a processing unit that is responsive to the first and second signals and a predetermined algorithm for selectively generating a fault signal; and
a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

In a preferred embodiment the processing unit includes a single processor.

In a preferred embodiment the single processor has at least one onboard analogue to digital converter.

In a preferred embodiment the single processor has a low frequency of operation.

According to a third aspect of the invention there is provided an electrical protection device including:

at least two input terminals for electrically connecting respectively to an active conductor and a neutral conductor of an electrical power source that is upstream of the protection device;

at least two output terminals for electrically connecting to a load that is downstream of the protection device and which draws a load current at a load voltage;

a first sensor for providing a first analogue signal derived from the load current;

a second sensor for providing a second analogue signal derived from the load voltage;

a processing unit that is responsive to: the first and second signals for generating digital signals; and the digital signals for selectively generating a fault signal; and a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

In a preferred embodiment the electrical protection device is a residual current device and the processing unit includes a single processor.

According to a fourth aspect of the invention there is provided a method of providing electrical protection to a load that draws a load current at a load voltage from a power source having an active conductor and a neutral conductor, the method including the steps of:

electrically connecting at least two input terminals to the active conductor and the neutral conductor;

electrically connecting at least two output terminals to the load;

providing a first signal derived from the load current;

providing a second signal derived from the load voltage;

being responsive to the first and second signals for selectively generating a fault signal; and being responsive to the fault signal for progressing a switching unit from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

According to a fifth aspect of the invention there is provided a method of providing electrical protection to a load which draws a load current at a load voltage from an electrical power source having an active conductor and a neutral conductor, the method including the steps of:

electrically connecting two input terminals to an active conductor and a neutral conductor;

electrically connecting at least two output terminals to the load;

providing a first analogue signal derived from the load current;

providing a second analogue signal derived from the load voltage;

being responsive to: the first and second signals for generating digital signals; and the digital signals for selectively generating a fault signal; and being responsive to the fault signal for progressing a switching unit from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

According to a sixth aspect of the invention there is provided an electrical protection device including:

at least two input terminals for electrically connecting respectively to an active conductor and a neutral conductor of an electrical power source that is upstream of the protection device;

at least two output terminals for electrically connecting to a load that is downstream of the protection device and which draws a load current at a load voltage;

a first sensor for providing a first signal derived from the load current;

a second sensor for providing a second signal derived from the load voltage;

a processing unit for: generating a third signal that is derived from at least one of the first and second signals; and being responsive to at least two of the first, second and third signals for selectively generating a fault signal; and a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

According to a seventh aspect of the invention there is provided an electrical protection device including:

at least two input terminals for electrically connecting respectively to an active conductor and a neutral conductor of an electrical power source that is upstream of the protection device;

at least two output terminals for electrically connecting to a load having a conductive chassis that is downstream of the protection device, the load drawing a load current;

a first sensor for providing a first signal derived from the load current;

a second sensor for providing a second signal derived from a voltage on the chassis;

a processing unit that is responsive to the first and second signals for selectively generating a fault signal; and a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

In a preferred embodiment the processing unit is directly responsive to the first and second signals for selectively generating the fault signal.

In a preferred embodiment the processing unit is indirectly responsive to the first and second signals for selectively generating the fault signal.

In a preferred embodiment the processing unit includes a processor that executes a predetermined algorithm which is responsive to the first and second signals for selectively generating the fault signal.

In a preferred embodiment the predetermined algorithm is responsive to: the first and second signals for calculating one or more secondary indication; and the one or more secondary indication for selectively generating the fault signal. In a further preferred embodiment processing unit includes memory and the processor selectively stores data in the memory for use in later calculating one or more of the secondary indications.

In a preferred embodiment the load has a leakage current and the first signal is indicative of the leakage current.

In a preferred embodiment the second signal derived from a current flowing from the chassis to a current sink. In a preferred embodiment the current sink is earth. In another preferred embodiment the current sink is the neutral conductor.

In a preferred embodiment the second signal is derived from a voltage differential between the chassis and a voltage reference. In another preferred embodiment the voltage reference is earth. In a preferred embodiment the voltage reference is the neutral conductor.

In a preferred embodiment the fault signal is generated in response to the first signal meeting a first fault condition. In a further preferred embodiment the first fault condition is the load current exceeding a predetermined first threshold. In a yet further preferred embodiment the processing unit will selectively generate the fault signal based on an assessment of one or more characteristics of the second signal.

In a preferred embodiment the fault signal is generated in response to the second signal meeting a second fault condition. In a further preferred embodiment the processing unit will selectively generate the fault signal based on an assessment of one or more characteristics of the first signal.

In a preferred embodiment the processing unit is responsive to a combination of both the first signal and the second signal and wherein the processing unit uses a qualitative decision process for determining if the fault signal will be generated.

In a preferred embodiment the processing unit is responsive to a combination of both the first signal and the second signal and wherein the processing unit uses a purely quantitative decision process for determining if the fault signal will be generated.

In a preferred embodiment the processing unit is responsive to a combination of both the first signal and the second signal and wherein the processing unit uses a combination of qualitative and quantitative decision processes for determining if the fault signal will be generated.

According to a eighth aspect of the invention there is provided an electrical protection device including:

at least two input terminals for electrically connecting respectively to an active conductor and a neutral conductor of an electrical power source that is upstream of the protection device;

at least two output terminals for electrically connecting to a load having a conductive chassis, the load being is downstream of the protection device and drawing a load current at a load voltage;

a first sensor for providing a first signal derived from the load current;

a second sensor for providing a second signal derived from a voltage on the chassis;

a third sensor for providing a third signal derived from a current in the chassis;

a processing unit that is responsive to the first, second and third signals for selectively generating a fault signal; and a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

In a preferred embodiment the processing unit is directly responsive to the first, second and third signals for selectively generating the fault signal.

In a preferred embodiment the processing unit is indirectly responsive to the first, second and third signals for selectively generating the fault signal.

In a preferred embodiment the processing unit is directly and indirectly responsive to the first, second and third signals for selectively generating the fault signal.

In a preferred embodiment the processing unit includes a processor for executing a predetermined algorithm which is responsive to the first, second and third signals for selectively generating the fault signal.

In a preferred embodiment the processing unit includes memory and the processor selectively stores data in the memory for use in later calculating one or more secondary indications.

In a preferred embodiment the first signal is derived from a load leakage current.

In a preferred embodiment the second signal is derived from a voltage differential between the voltage on the chassis and a reference voltage. In a further preferred embodiment the voltage reference is the neutral conductor. In a further preferred embodiment the voltage reference is earth.

In a preferred embodiment the third signal is indicative of a current flowing from the chassis to a current sink. In a further preferred embodiment the current sink is the neutral conductor. In another further preferred embodiment the current sink is earth.

In a preferred embodiment processing unit is responsive to the first signal reaching a first threshold for assessing one or more characteristics of the second and/or third signals and then selectively generating the fault signal.

In a preferred embodiment the processing unit is responsive to the second signal reaching a second threshold for assessing one or more characteristics of the first and/or third signals and then selectively generating the fault signal.

In a preferred embodiment the processing unit is responsive to the third signal reaching a third threshold for assessing one or more characteristics of the first and/or second signals and then selectively generating the fault signal.

In a preferred embodiment the processing unit is responsive to the combination of the first, second and third signals and wherein the processing unit uses a qualitative decision process for determining if the fault signal will be generated.

In a preferred embodiment the processing unit is responsive to a combination of the first, second and third signals and wherein the processing unit uses a purely quantitative decision process for determining if the fault signal will be generated.

In a preferred embodiment the processing unit is responsive to a combination of the first, second and third signals and wherein the processing unit uses a combination of qualitative and quantitative decision processes for determining if the fault signal will be generated.

According to a ninth aspect of the invention there is provided an electrical protection device including:

at least two input terminals for electrically connecting respectively to an active conductor and a neutral conductor of an electrical power source that is upstream of the protection device;

at least two output terminals for electrically connecting to a load having a conductive chassis, the load being downstream of the protection device and drawing a load current at a load voltage;

a first sensor for providing a first signal derived from the load current;

a second sensor for providing a second signal derived from a current in the conductive chassis;

a processing unit that is responsive to the first and second signals for selectively generating a fault signal; and a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

In a preferred embodiment the processing unit is directly responsive to the first and second signals for selectively generating the fault signal.

In a preferred embodiment the processing unit is indirectly responsive to the first and second signals for selectively generating the fault signal.

In a preferred embodiment the processing unit is directly and indirectly responsive to the first and second signals for selectively generating the fault signal.

In a preferred embodiment the processing unit includes a processor for executing a predetermined algorithm which is responsive to the first and second signals for selectively generating the fault signal.

In a preferred embodiment the processing unit includes memory and the processor selectively stores data in the memory for use in later calculating one or more secondary indications.

In a preferred embodiment the first signal is derived from a load leakage current.

In a preferred embodiment the second signal is indicative of a current flowing from the chassis to a current sink. In a further preferred embodiment the current sink is the neutral conductor. In another further preferred embodiment the current sink is earth.

In a preferred embodiment processing unit is responsive to the first signal reaching a first threshold for assessing one or more characteristics of the second signal and then selectively generating the fault signal.

In a preferred embodiment the processing unit is responsive to the second signal reaching a second threshold for assessing one or more characteristics of the first signal and then selectively generating the fault signal.

In a preferred embodiment the processing unit is responsive to the combination of the first and second signals and wherein the processing unit uses a qualitative decision process for determining if the fault signal will be generated.

In a preferred embodiment the processing unit is responsive to a combination of the first and second signals and wherein the processing unit uses a purely quantitative decision process for determining if the fault signal will be generated.

In a preferred embodiment the processing unit is responsive to a combination of the first and second signals and wherein the processing unit uses a combination of qualitative and quantitative decision processes for determining if the fault signal will be generated.

According to a ninth aspect of the invention there is provided an electrical protection device including:

at least two input terminals for electrically connecting respectively to an active conductor and a neutral conductor of an electrical power source that is upstream of the protection device;

at least two output terminals for electrically connecting to a load having a conductive chassis, the load being downstream of the protection device and drawing a load current at a load voltage;

a first sensor for providing a first signal derived from the load current;

a second sensor for providing a second signal derived from a voltage in the conductive chassis;

a processing unit that is responsive to the first and second signals for selectively generating a fault signal; and a switching unit that is responsive to the fault signal for progressing from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

In a preferred embodiment the processing unit is directly responsive to the first and second signals for selectively generating the fault signal.

In a preferred embodiment the processing unit is indirectly responsive to the first and second signals for selectively generating the fault signal.

In a preferred embodiment the processing unit is directly and indirectly responsive to the first and second signals for selectively generating the fault signal.

In a preferred embodiment the processing unit includes a processor for executing a predetermined algorithm which is responsive to the first and second signals for selectively generating the fault signal.

In a preferred embodiment the processing unit includes memory and the processor selectively stores data in the memory for use in later calculating one or more secondary indications.

In a preferred embodiment the first signal is derived from a load leakage current.

In a preferred embodiment the second signal is derived from a voltage differential between the voltage on the chassis and a reference voltage. In a further preferred embodiment the voltage reference is the neutral conductor. In a further preferred embodiment the voltage reference is earth.

In a preferred embodiment processing unit is responsive to the first signal reaching a first threshold for assessing one or more characteristics of the second signal and then selectively generating the fault signal.

In a preferred embodiment the processing unit is responsive to the second signal reaching a second threshold for assessing one or more characteristics of the first signal and then selectively generating the fault signal.

In a preferred embodiment the processing unit is responsive to the combination of the first and second signals and wherein the processing unit uses a qualitative decision process for determining if the fault signal will be generated.

In a preferred embodiment the processing unit is responsive to a combination of the first and second signals and wherein the processing unit uses a purely quantitative decision process for determining if the fault signal will be generated.

In a preferred embodiment the processing unit is responsive to a combination of the first and second signals and wherein the processing unit uses a combination of qualitative and quantitative decision processes for determining if the fault signal will be generated.

According to an eleventh aspect of the invention there is provided a method of providing electrical protection to a load having a conductive chassis, the load drawing a load current from an electrical power source having an active conductor and a neutral conductor, the method including the steps of:

electrically connecting two input terminals to the active conductor and the neutral conductor;

electrically connecting at least two output terminals to the load;

providing a first analogue signal derived from the load current;

providing a second analogue signal derived from a voltage on the chassis;

being responsive to: the first and second signals for generating digital signals; and the digital signals for selectively generating a fault signal; and being responsive to the fault signal for progressing a switching unit from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

According to a twelfth aspect of the invention there is provided a method of providing electrical protection to a load having a conductive chassis, the load drawing a load current from an electrical power source having an active conductor and a neutral conductor, the method including the steps of:

electrically connecting two input terminals to the active conductor and the neutral conductor;

electrically connecting at least two output terminals to the load;

providing a first analogue signal derived from the load current;

providing a second analogue signal derived from a voltage on the chassis;

providing a third analogue signal derived from a current in the chassis;

being responsive to: the first, second and third signals for generating digital signals; and the digital signals for selectively generating a fault signal; and being responsive to the fault signal for progressing a switching unit from a first state to a second state, wherein: in the first state the input terminals are electrically connected to the output terminals to allow the load current to be drawn from the source to the load; and in the second state the input terminals are electrically isolated from the output terminals and prevent the load current being drawn from the source to the load.

Reference throughout this specification to "one embodiment", "some embodiments" or "an embodiment" means that a particular feature, structure or characteristic described in connection with the embodiment is included in at least one embodiment of the present invention. Thus, appearances of the phrases "in one embodiment", "in some embodiments" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

As used herein, the term "exemplary" is used in the sense of providing examples, as opposed to indicating quality. That is, an "exemplary embodiment" is an embodiment provided as an example, as opposed to necessarily being an embodiment of exemplary quality.

BRIEF DESCRIPTION OF THE DRAWINGS

Embodiments of the invention will now be described, by way of example only, with reference to the accompanying drawings in which.

DETAILED DESCRIPTION

Figure 1:
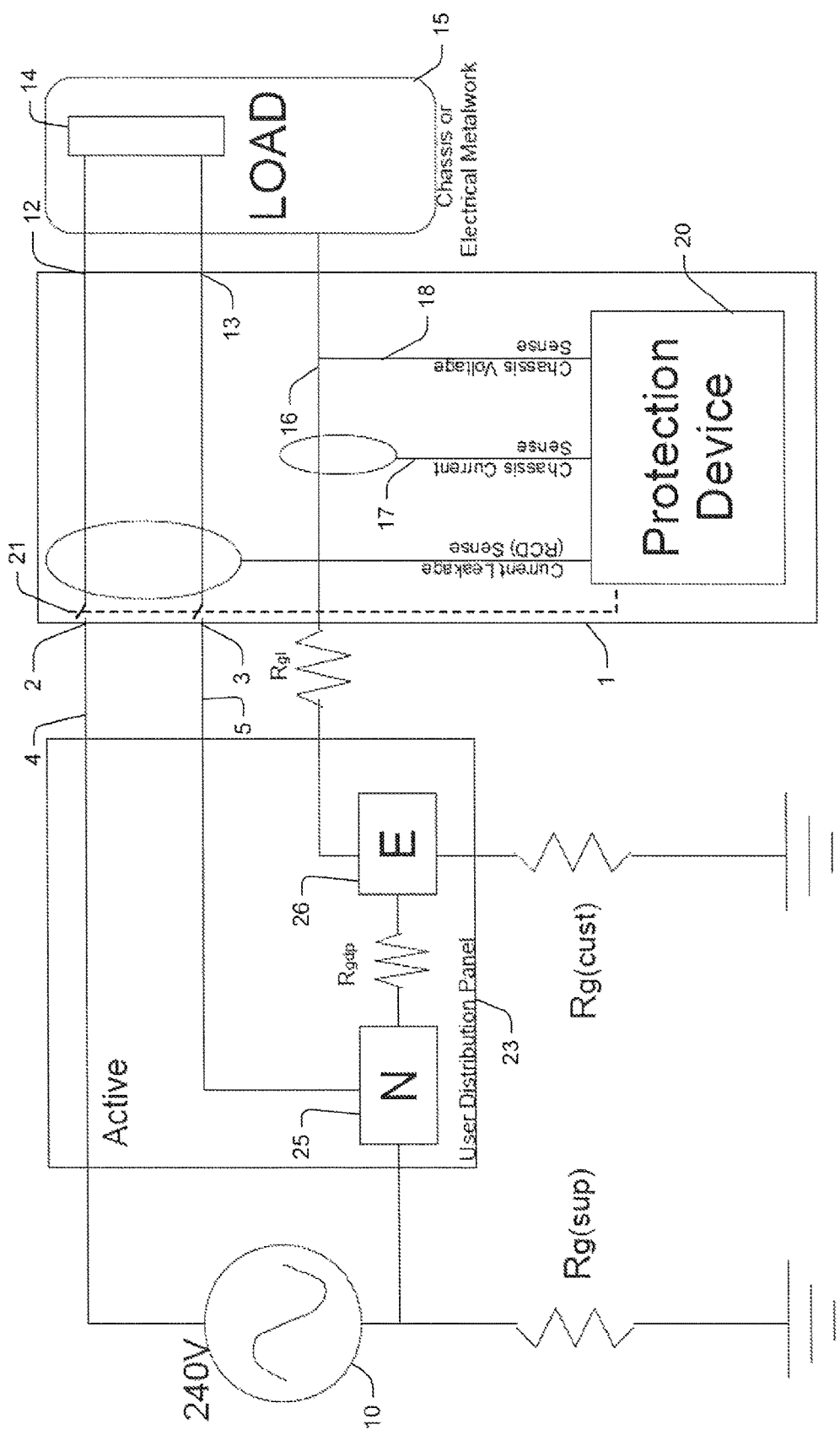
FIG. 1 is a block diagram of an electrical protection device according to one embodiment of the invention monitoring a circuit having a power source and a load.

Referring initially to FIG. 1, an electrical protection device 1 includes two input terminals 2 and 3 for electrically connecting respectively to an active conductor 4 and a neutral conductor 5 of an electrical power source 10 that is upstream of device 1. Device 1 further includes two output terminals 12 and 13 for electrically connecting to a load 14 having a conductive metal chassis 15 (or electric metal work or casing) that is downstream of device 1. Load 14 draws a load current at a load voltage. Device 1 includes a first sensor for providing a first signal derived from the load current, specifically the leakage current from the load. Furthermore, device 1 includes a second sensor for providing a second signal derived from the voltage on chassis 15, specifically a current in chassis 15 and a voltage on chassis 15. Furthermore, device 1 includes a processing unit in the form of a microprocessor 20 is responsive to the first and second signals for selectively generating a fault signal. Device 1 also includes a switching unit 21 that is responsive to the fault signal for progressing from a first state to a second state, wherein: in the first state input terminals 2 and 3 are electrically connected to output terminals 12 and 13 to allow the load current to be drawn from source 10 to load 14; and in the second state input terminals 2 and 3 are electrically isolated from output terminals 12 and 13 and prevent the load current being drawn from source 10 to load 14.

There is further included an earthed sensor line 16 in electrical communication with chassis 15. Device 1 includes a first sensor input 17 and a second sensor input 18 for respectively sensing current flowing from chassis 15 to a current sink and voltage between chassis 15 and a reference voltage in the form of neutral conductor 5. In some embodiments the current sink is earth, and in other embodiments the current sink is neutral conductor 5. In other embodiments, the reference voltage is other than neutral conductor 5, for example in one other embodiment the reference voltage is earth.

The resistors in FIG. 1 are modelling resistors that are indicative of the resistance between the respective components of the circuit. Specifically: $R_{gl}$ is the resistance in the ground wire from the MEN point and the load. This resistance may be significant due to poor installation or maintenance practises. $R_{gdp}$ is the resistance between a neutral earth bar 25 and an earth bar 26 within a distribution panel 23. $R_g$(cust) is the customer earth resistance, which is normally the resistance of the wire connection to the earth stake and the earth stake resistance to actual earth. $R_g$(sup) is the resistance between the power supply and actual earth. All of the resistances ($R_{gl}$, $R_{gdp}$, $R_g$(cust) and $R_g$(sup)) can be relatively large due to, for example, poor maintenance, poor installation practises or in the case of the earth, the characteristics of the earth itself.

Figure 2:
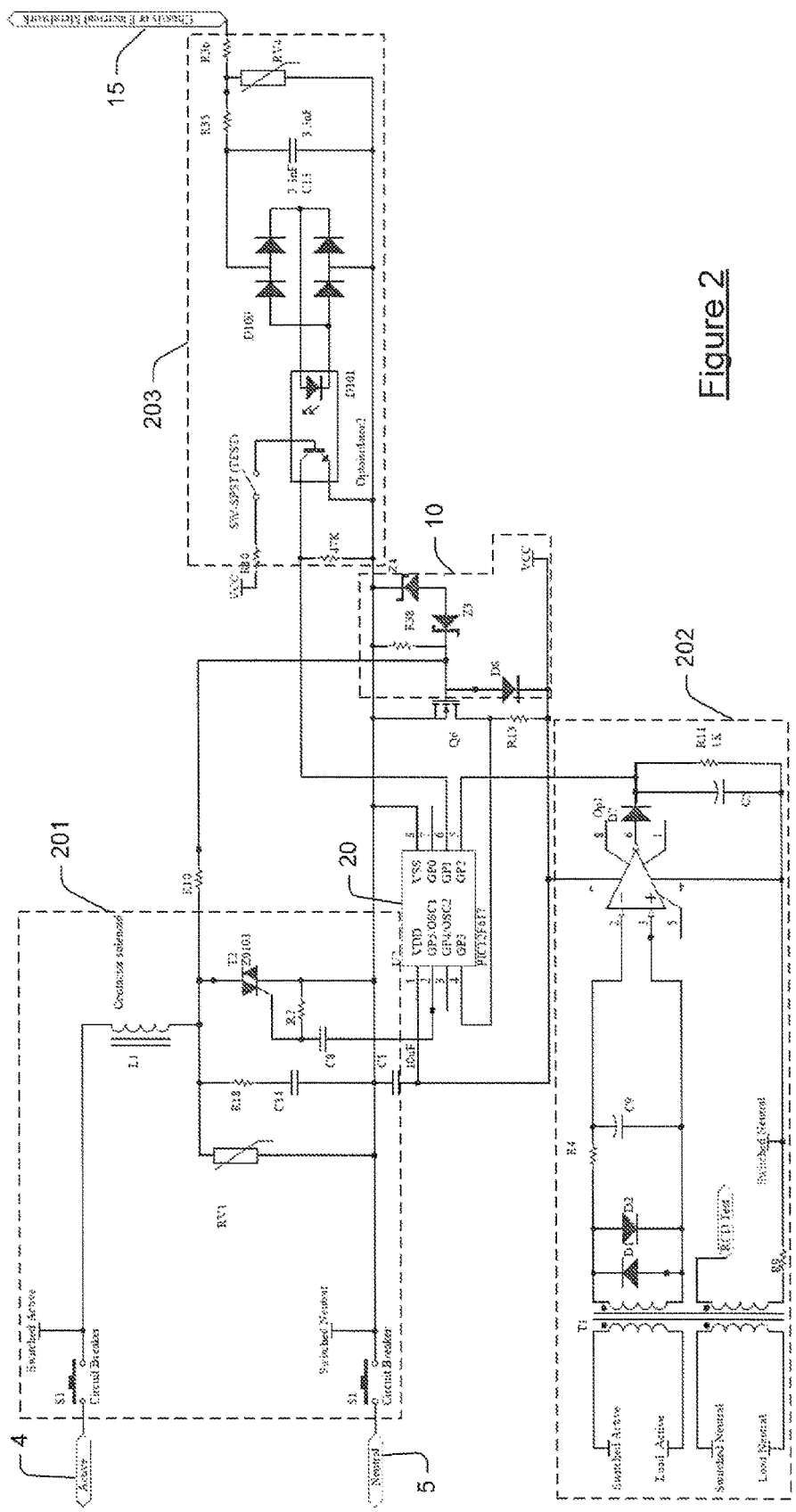
FIG. 2 is a schematic circuit diagram according to one embodiment of the invention.

Referring now to FIG. 2, this embodiment of device 1 includes circuit leakage (residual current) technology with chassis voltage sensing. More specifically, there is an integration of the leakage current functions of the RCD (referred to herein as the RCD sub-system) and a voltage sensing function on the load chassis 15 (referred to herein as the voltage sensing sub-system). The outputs of each sensing function are placed on to separate inputs of microprocessor 20. Microprocessor 20 includes integral, analogue to digital conversion. The signals are digitalised and signal processed by microprocessor 20 and considered in unison when assessing the need to take protected action. The protective action function is driven by a single output of microprocessor 20 (referred to in FIG. 2 as GP5 on component U2). By integrating the two capabilities into one decision making system/algorithm, and considering the performance of the circuit in terms of leakage current as it correlated with elevated protective earth voltages (and vice versa), this embodiment of device 1 is able to investigate a protected electrical system and make much more precise and discerning decisions on electrical status and probability of unsafe events. The resultant device attends to many of the outstanding issues with the prior art technologies as they stand, and provides a protection solution that covers the entire range of electrical power wiring configurations and the practical complexities of modern electrical metal works.

Following is a table of preliminary component values for FIG. 2:

| Reference | Quantity | Component | Comment | Pattern |
|---|---|---|---|---|
| C8 | 1 | Capacitor | | RAD-0.3 |
| C1 | 1 | Capacitor | 10 uF | RAD-0.3 |
| R11 | 1 | Resistor | 1K | AXIAL-0.3 |
| R10 | 1 | Resistor (1W) | 220k | AXIAL-0.3 |
| C14 | 1 | Capacitor | 220 nF | RAD-0.3 |
| R7 | 1 | Resistor | 2K | AXIAL-0.3 |
| Q6 | 1 | N-Channel MOSFET | 2N7002W | BCY-W3/H.8 |
| C13 | 1 | Capacitor | 3.3 nF | RAD-0.3 |
| R35 | 1 | Resistor | 470k | AXIAL-0.3 |
| Z3, Z4 | 2 | Zener Diode | 5V6 | SOT23 |
| R18 | 1 | Resistor | 70R | AXIAL-0.3 |
| D100, D101 | 2 | Medium-speed Switching Double Diode with Low Leakage Current | BAV199 | SOT23_N |
| D8 | 1 | Diode | BAV99W | |
| C5, C9 | 2 | Capacitor | Cap2 | CAPR5-4X5 |
| S1, S1 | 2 | Switch | Circuit Breaker | SPST-2 |
| L1 | 1 | Magnetic-Core Inductor | Contactor solenoid | AXIAL-0.9 |
| D1, D2, D? | 3 | 1 Amp General Purpose Rectifier | Diode 1N4006 | DO-41 |
| R36 | 1 | Resistor | fusible Resistor | AXIAL-0.3 |
| Op1 | 1 | FET Operational Amplifier | Op Amp | CAN-8/D9.4 |
| 4n25 | 1 | 5 Pin Mini Flat Pack Optocoupler | Optoisolator2 | SOP5(6) |
| U2 | 1 | Microprocessor | PIC12F617 | DIP8 |
| R4, R9, R10, R13, R38, R101 | 6 | Resistor | Res1 | AXIAL-0.3 |
| S1 | 1 | Single-Pole, Single-Throw Switch | SW-SPST (TEST) | SPST-2 |
| T1 | 1 | Buck-boost Transformer (Ideal) | Trans BB | TRF_8 |
| RV1, RV4 | 2 | Industrial High Energy Metal-Oxide Varistor | V270ZA1 | SIL-P2/C5.5 |
| T2 | 1 | Triac | Z0103 | SFM-T3/A2.4V |

It is emphasised that the component values provided in the table above are an indicative example only and will vary in practice.

FIG. 2 has five main circuit sub-sections: a Thyristor protective action circuit 201; a power supply ($V_{dd}$) 10 (corresponding to the power supply of FIG. 1); the microprocessor 20; a RCD input interface 202; and a Chassis voltage input interface 203.

Thyristor protective action circuit 201 is made up of thyristor T2 and a number of surrounding components. Thyristor T2 is triggered from output GP5 of microprocessor 20. When T2 triggers it connects the output connection of the contactor solenoid L1 to the neutral conductor 5. A large current is driven by mains voltage through solenoid L1 that causes the breaker contactors S1 and S2 to open and disconnect mains voltage from the circuit and the load, this being the protective action. The surrounding components around T2 of resistor R18, capacitor C14, resistor R7 and capacitor C8 are to ensure stable operation of the thyristor. RV1 is a non-linear resistor providing a degree of over voltage protection for the entire circuit.

Resistor R10, zener diodes Z4 and Z3, resistor R38 and diode D4 make up a simple DC power supply for the active components of the circuit. The DC power supply is driven directly from the mains (switched Active) through solenoid L1.

Microprocessor 20, component U2 (PIC12F617), is a simple PIC microprocessor with analogue to digital converter inputs GP0, GP1 and GP2. The microprocessor receives voltages from the RCD and Chassis voltage sense circuits, digitises them and after appropriate processing (discussed further below) drives the thyristor protective action circuit through GP5.

RCD input interface 202 is made up of leakage transformer T1 feeding operational amplifier Op1. Any leakage signal from the transformer (which carries both active and neutral current in its duel primary windings) is amplified by Op1 for input into microprocessor 20. Diodes D1 and D2 provide overvoltage protection. Resistor R4 and capacitor C9 provide a degree of filtering to reduce leakage signal noise. Op1 drives analogue to digital input GP2 through additional filtering resistor R11 and capacitor C5. RCD Test input is an optional test input for the RCD circuit.

Chassis voltage input interface 203 provides sensing by Optoisolator 2 driving GP1 of microprocessor 20. Connection to the chassis voltage (though sensor wire 16 connection which may be the protective earth) is made through resistors R35 and R36. Resistor R36 is a fusable resistor. Variable resistor RV4 and resistor R36 provide a level of overvoltage protection. Capacitor C13 in combination with resistor R35 provide noise filtering. Diodes D100 provide a full wave rectification bridge so both positive and negative cycles of the sense voltage drive current through optoisolator2 primary LED. The output of optoisolator2 is input to GP1. Switch SW-SPST(TEST) provides a test input for the chassis voltage input interface 203.

Figure 3:
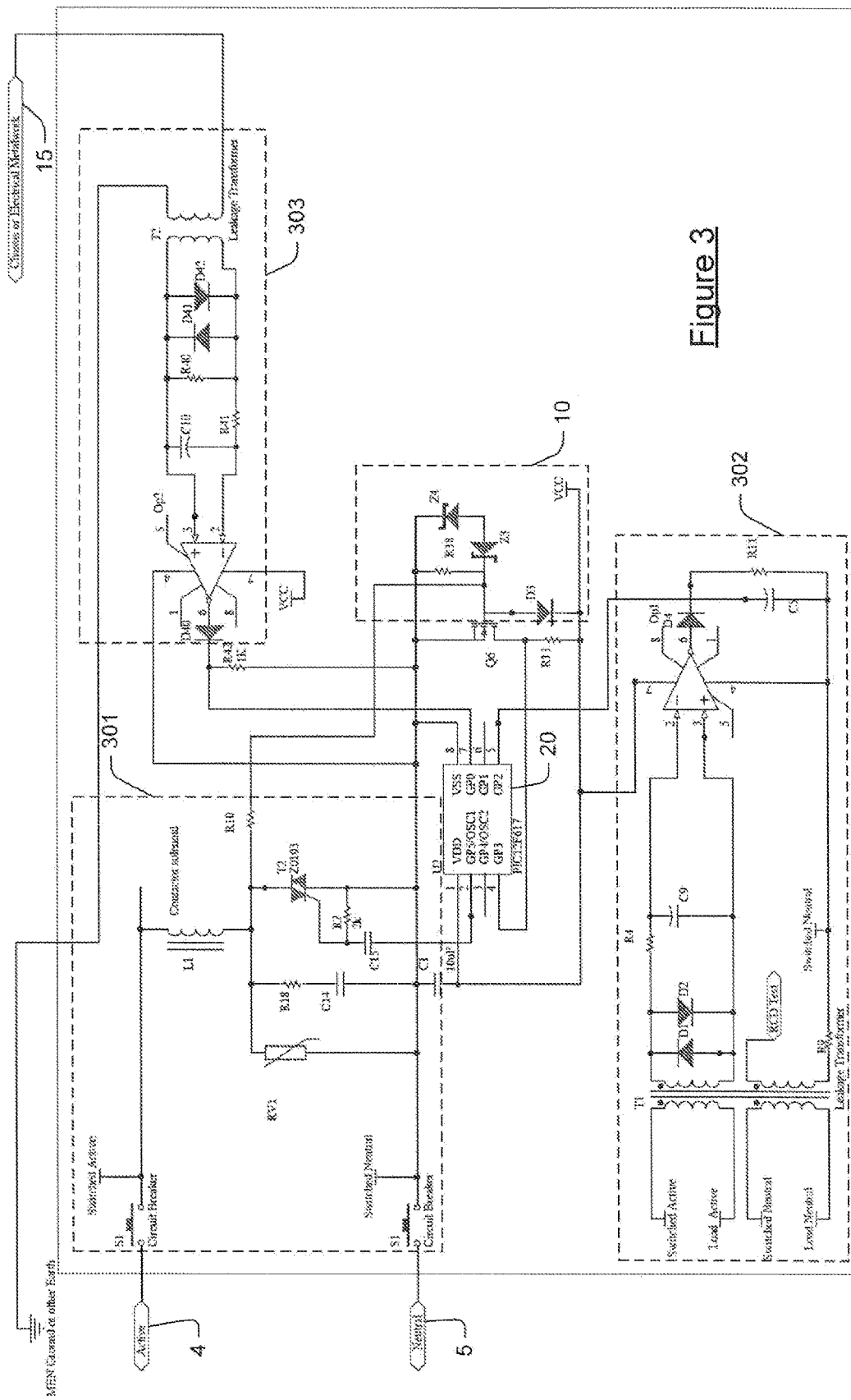
FIG. 3 is a schematic circuit diagram according to another embodiment of the invention.

Referring now to FIG. 3, this embodiment of device 1 includes circuit leakage (residual current) technology with chassis current sensing. More specifically, there is an integration of the leakage current functions of the RCD (referred to herein as the RCD sub-system) and a current sensing function on the load chassis 15 (referred to herein as the current sensing sub-system). The outputs of each sensing function are placed on to separate inputs of microprocessor 20. As with the embodiment of FIG. 2, Microprocessor 20 of the embodiment of FIG. 3 includes integral, analogue to digital conversion. The signals are digitalised and signal processed by microprocessor 20 and considered in unison when assessing the need to take protected action. The protective action function is driven by a single output of microprocessor 20 (referred to in FIG. 3 as 'GP5' on component 'U2'). By integrating the two capabilities into one decision making system/algorithm, and considering the performance of the circuit in terms of leakage current as it correlated with any current on the chassis (and vice versa), this embodiment of device 1 is able to investigate a protected electrical system and make much more precise and discerning decisions on electrical status and probability of unsafe events. The resultant device attends to many of the outstanding issues with the prior art technologies as they stand, and provides a protection solution that covers the entire range of electrical power wiring configurations and the practical complexities of modern electrical metal works.

Following is a table of preliminary component values for FIG. 3:

| Reference | Quantity | Component | Comment | Pattern |
| --- | --- | --- | --- | --- |
| C1 | 1 | Capacitor | 10 uF | RAD-0.3 |
| R42 | 1 | Resistor | 1K | AXIAL-0.3 |
| C14 | 1 | Capacitor | 200 nF | RAD-0.3 |
| R10 | 1 | Resistor (1W) | 220k | AXIAL-0.3 |
| R7 | 1 | Resistor | 2k | AXIAL-0.3 |
| Q6 | 1 | N-Channel MOSFET | 2N7002W | BCY-W3/H.8 |
| C15 | 1 | Capacitor | 33 nF | RAD-0.3 |
| Z3, Z4 | 2 | Zener Diode | 5V6 | SOT23 |
| R18 | 1 | Resistor | 70R | AXIAL-0.3 |
| D3 | 1 | switching diode | BAV99W | |
| C5, C9, C10 | 3 | Capacitor | Cap2 | CAPR5-4X5 |
| S1, S1 | 2 | Switch | Circuit Breaker | SPST-2 |
| L1 | 1 | Magnetic-Core Inductor | Contactor solenoid | AXIAL-0.9 |
| D1, D2, D4, D40, D41, D42 | 6 | 1 Amp General Purpose Rectifier | Diode 1N4006 | DO-41 |
| T2 | 1 | Transformer | Leakage Transformer | TRANS |
| T1 | 1 | Buck-boost Transformer (Ideal) | Leakage Transformer | TRF_8 |
| Op1, Op2 | 2 | FET Operational Amplifier | Op Amp | CAN-8/D9.4 |
| U2 | 1 | Microprocessor | PIC12F617 | DIP8 |
| R4, R9, R11, R13, R38, R40, R41 | 7 | Resistor | Res1 | AXIAL-0.3 |
| RV1 | 1 | Industrial High Energy Metal-Oxide Varistor | V270ZA1 | SIL-P2/C5.5 |
| T2 | 1 | Triac | Z0103 | SFM-T3/A2.4V |

It is emphasised that the component values provided in the table above are an indicative example only and will vary in practice.

FIG. 3 has five main circuit sub-sections: a Thyristor protective action circuit 301; a power supply ($V_{dd}$) 10 (corresponding to the power supply of FIGS. 1 and 2); the microprocessor 20; a RCD input interface 302; and a Chassis current input interface 303.

Thyristor protective action circuit 301, power supply 10 and RCD input interface 302 of FIG. 3 operate identically to thyristor protective action circuit 201, power supply 10 and RCD input interface 202 of FIG. 2.

Chassis current input interface 303 provides sensing by from operational amplifier Op2 and T2. T2 is a current transformer responsive to current in the chassis earth connection (or sense line). Diodes D41 and D42 provide overvoltage protection. Resistor R41 and capacitor C10 provide input filtering to reduce noise. The output of Op2 drives GP0 of the microprocessor.

Figure 4:
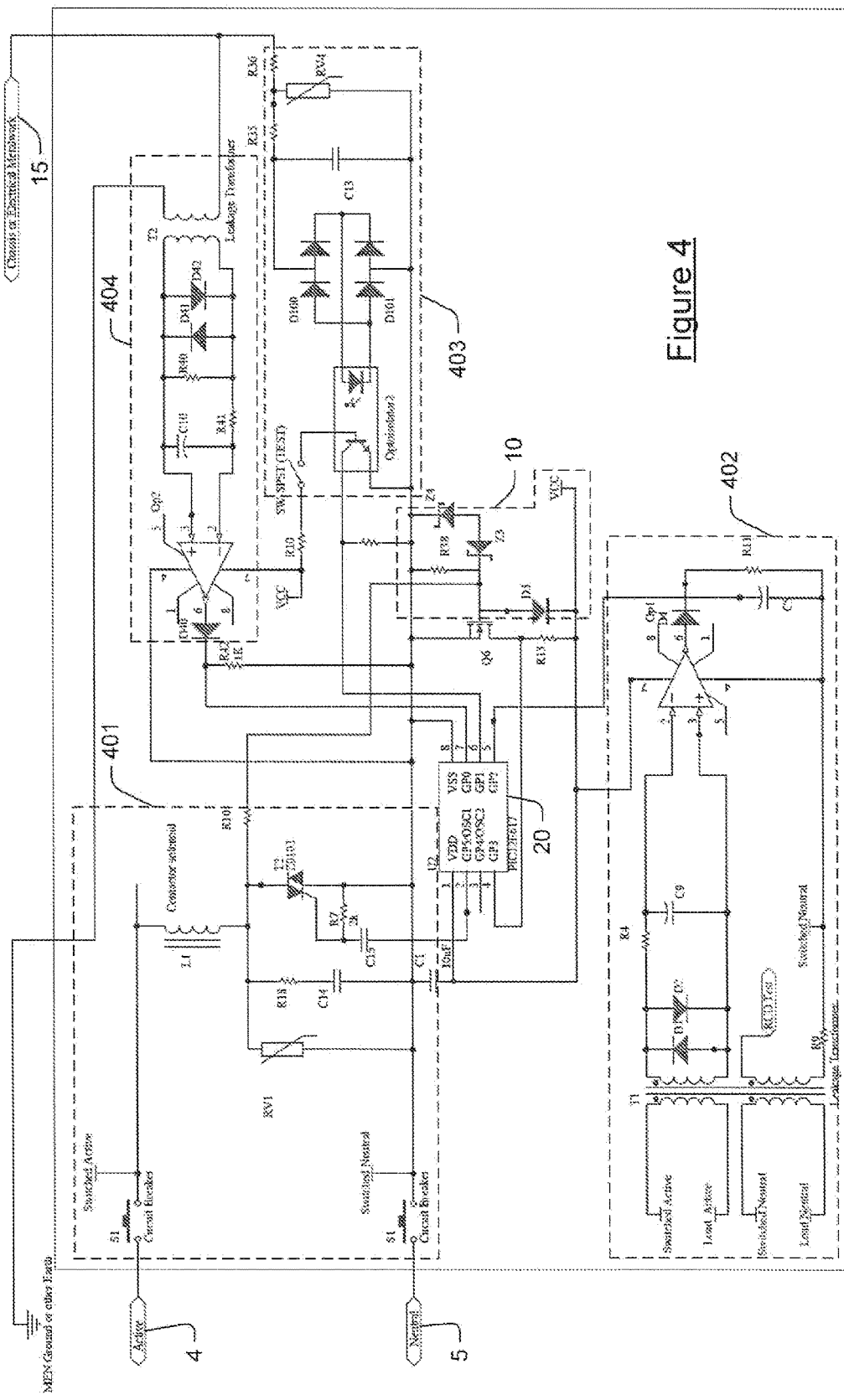
FIG. 4 is a schematic circuit diagram according to yet another embodiment of the invention.

Referring to FIG. 4, this embodiment of device 1 includes circuit leakage (residual current) technology (referred to herein as the RCD sub-system), chassis voltage sensing (referred to herein as the voltage sensing sub-system) and chassis current sensing (referred to herein as the current sensing sub-system). More specifically, there is an integration of the leakage current functions of the RCD, the voltage sensing function on the load chassis 15 and the current sensing function on the load chassis 15. The outputs of each sensing function are placed on to separate inputs of microprocessor 20. Similar to the embodiments of FIGS. 2 and 3, microprocessor 20 in the embodiment of FIG. 4 includes integral, analogue to digital conversion. The signals are digitalised and signal processed by microprocessor 20 and considered in unison when assessing the need to take protected action. By integrating the three capabilities into one decision making system/algorithm (and considering the circuits performance in terms of leakage current as it correlated with elevated protective earth voltages (and vice versa) and the capability of any elevated protection earth voltage to drive current to a protective earth current sink) an embodiment is created which is further able to "look into" a protected electrical system and make precise and discerning decisions on electrical status and probability of unsafe events. The resultant device further attends to the outstanding issues with the prior art technologies as they stand, and provides a protection solution that covers the entire range of electrical power wiring configurations and the practical complexities of modern electrical works.

Following is a table of preliminary component values for FIG. 4.

| Reference | Quantity | Component | Comment | Pattern |
|---|---|---|---|---|
| C1 | 1 | Capacitor | 10 uF | RAD-0.3 |
| R42 | 1 | Resistor | 1K | AXIAL-0.3 |
| C14 | 1 | Capacitor | 200 nF | RAD-0.3 |
| R10 | 1 | Resistor (1W) | 220k | AXIAL-0.3 |
| R7 | 1 | Resistor | 2k | AXIAL-0.3 |
| Q6 | 1 | N-Channel MOSFET | 2N7002W | BCY-W3/H.8 |
| C13 | 1 | Capacitor | 3.3 nF | RAD-0.3 |
| C15 | 1 | Capacitor | 33 nF | RAD-0.3 |
| R35 | 1 | Resistor | 470k | AXIAL-0.3 |
| Z3, Z4 | 2 | Zener Diode | 5V6 | SOT23 |
| R18 | 1 | Resistor | 70R | AXIAL-0.3 |
| D100, D101 | 2 | Medium-speed Switching Double Diode with Low Leakage Current | BAV199 | SOT23_N |
| D3 | 1 | Diode | BAV99W | |
| C5, C9, C10 | 3 | Capacitor | Cap2 | CAPR5-4X5 |
| S1, S1 | 2 | Switch | Circuit Breaker | SPST-2 |
| L1 | 1 | Magnetic-Core Inductor | Contactor solenoid | AXIAL-0.9 |
| D1, D2, D4, D40, D41, D42 | 6 | 1 Amp General Purpose Rectifier | Diode 1N4006 | DO-41 |
| R36 | 1 | Resistor | fusible | AXIAL-0.3 |
| T2 | 1 | Transformer | Leakage Transformer | TRANS |
| T1 | 1 | Buck-boost Transformer (Ideal) | Leakage Transformer | TRF_8 |
| Op1, Op2 | 2 | FET Operational Amplifier | Op Amp | CAN-8/D9.4 |
| 4n25 | 1 | 5 Pin Mini Flat Pack Optocoupler | Optoisolator2 | SOP5(6) |
| U2 | 1 | Microprocessor | PIC12F617 | DIP8 |
| R4, R9, R10, R11, R13, R38, R40, R41, R101 | 9 | Resistor | Res1 | AXIAL-0.3 |
| S1 | 1 | Single-Pole, Single-Throw Switch | SW-SPST (TEST) | SPST-2 |
| RV1, RV4 | 2 | Industrial High Energy Metal-Oxide Varistor | V270ZA1 | SIL-P2/C5.5 |
| T2 | 1 | Triac | Z0103 | SFM-T3/A2.4V |

It is emphasised that the component values provided in the table above are an indicative example only and will vary in practice.

FIG. 4 has six main circuit sub-sections: a Thyristor protective action circuit 401; the power supply (including power source 10, the mains voltage); the microprocessor 20; a RCD input interface 402; a Chassis voltage input interface 403; and a Chassis current input interface 404.

Thyristor protective action circuit 401, power supply 10 and RCD input interface 402 of FIG. 4 operate identically to thyristor protective action circuits 201 and 301, power supplies 10 and RCD input interfaces 202 and 302 of FIGS. 2 and 3 respectively. Furthermore, chassis voltage input interface 403 operates identically to chassis voltage input interface 203 and chassis current input interface 404 operates identically to chassis current input interface 303.

FIG. 4 is identical to FIG. 2 with the additional chassis current sense capability made from Op2 and T2. FIG. 4 is also identical to FIG. 3 with the additional chassis voltage sense capability made from Optoisolator2 and full wave rectification bridge provided by diodes D100 and D101.

In these embodiments the digital fault signals of all the circuit leakage (residual current) and either of the chassis voltage and the chassis current, or in the embodiment of FIG. 4 both the chassis voltage and current, sensing are combined within microprocessor 20. An algorithm exists within microprocessor 20 to use both qualitative (rule driven) and purely quantitative (mathematically or theoretically derived) decision processes to assess all fault signals in concert. The qualitative and quantitative decision processes involve time correlation, fast Fourier transform (FFT) and impulse analysis, which will be explained in further detail below. It will be appreciated that, in other embodiments, other forms of quantitative and qualitative analysis is used.

If, in the case of the scenario described above, the less than threshold fault signals from the leakage current and chassis sensing are received at the same time by microprocessor 20, and the microprocessor confirms that the two signals are indicative of being from a common fault (when the frequency, phase, time and impulse behaviour are appropriate characteristics to support such a conclusion) then the microprocessor can act appropriately to generate the protective action.

As is apparent from the disclosure above, the embodiment of FIG. 4 includes additional features over the embodiments of FIGS. 2 and 3 in that it considers both the chassis voltage and the ability of the chassis voltage to drive current (as opposed to the embodiments of FIGS. 2 and 3 that consider one or the other). Therefore the embodiment of FIG. 4 also considers the impedance of the fault. However, the embodiment of FIGS. 2 and 3 provide significant improvements over the prior art and are suitable for many purposes while being a less costly alternative to the device of FIG. 4.

It is anticipated in a similar way that any two combinations of leakage current, chassis voltage sensing or chassis current sensing (such as those in the embodiments of FIGS. 2 and 3) may be used to provide improvements over the prior art and suitable for many purposes while being a less costly alternative to the device of FIG. 4.

As a result, the embodiments of FIGS. 2, 3 and 4 are capable of an integrated decision-making process, matching voltage and current fault signals in term of magnitude, time and phase from the multiple sensors to generate the protective function. Moreover, the various selected characteristics of these signals may be correlated into a decision making algorithm which provides:

Improved leakage current decisions in the RCD mode by considering the signals from the voltage and current sensing sub-systems.

Improved ground or protective metal work voltage decisions in the voltage sensing mode by considering the signals from the current sensing and RCD sub-systems.

Improved ground or protective metal work current decisions in the current sensing mode by considering the signals from the voltage sensing and RCD sub-systems.

Joint decisions which correlate the leakage current sense signals with the earth and protective metal work signals in a combined mode to:
  i) Anticipate safety situations with improve sensitivity and accuracy, and at an earlier time.
  ii) Identify safety situations in higher levels of interference and noise.
  iii) Identify interference signals (from earth loops, third party faults, and electrical transients etc.) and thus reduce the number of nuisance activations.

For example:
(1) In the case when the leakage current signal is finite but below a threshold to trigger a circuit leakage (residual current) response (due to the fault characteristics), but is coupled with an elevated but again below threshold voltage sensing signal (as described above), a decision to institute a protective action will still be prudent in given circumstances.
(2) In the case where a threshold chassis current signal is apparent but circuit leakage (residual current) signals show no loss of current from the circuit, a protective action may not be generated. In this case it is apparent that chassis sense signals are not as a result of a fault which is controlled by the protection, so causing a protective action will only generate a service outage without clearing the fault. Rather, in this case device 1 can provide an alarm for further investigation by technical staff, without causing a unnecessary service outage as would be caused by existing technology.
(3) In the case when the frequency, impulsive behaviour, phase and amplitude modulation of signals do not correlate (that is, the signals are corrupted by noise), either threshold may be varied up or down depending on the criticality of the equipment under supply and the characteristics of the signals and the lack of correlation.

Figure 5:
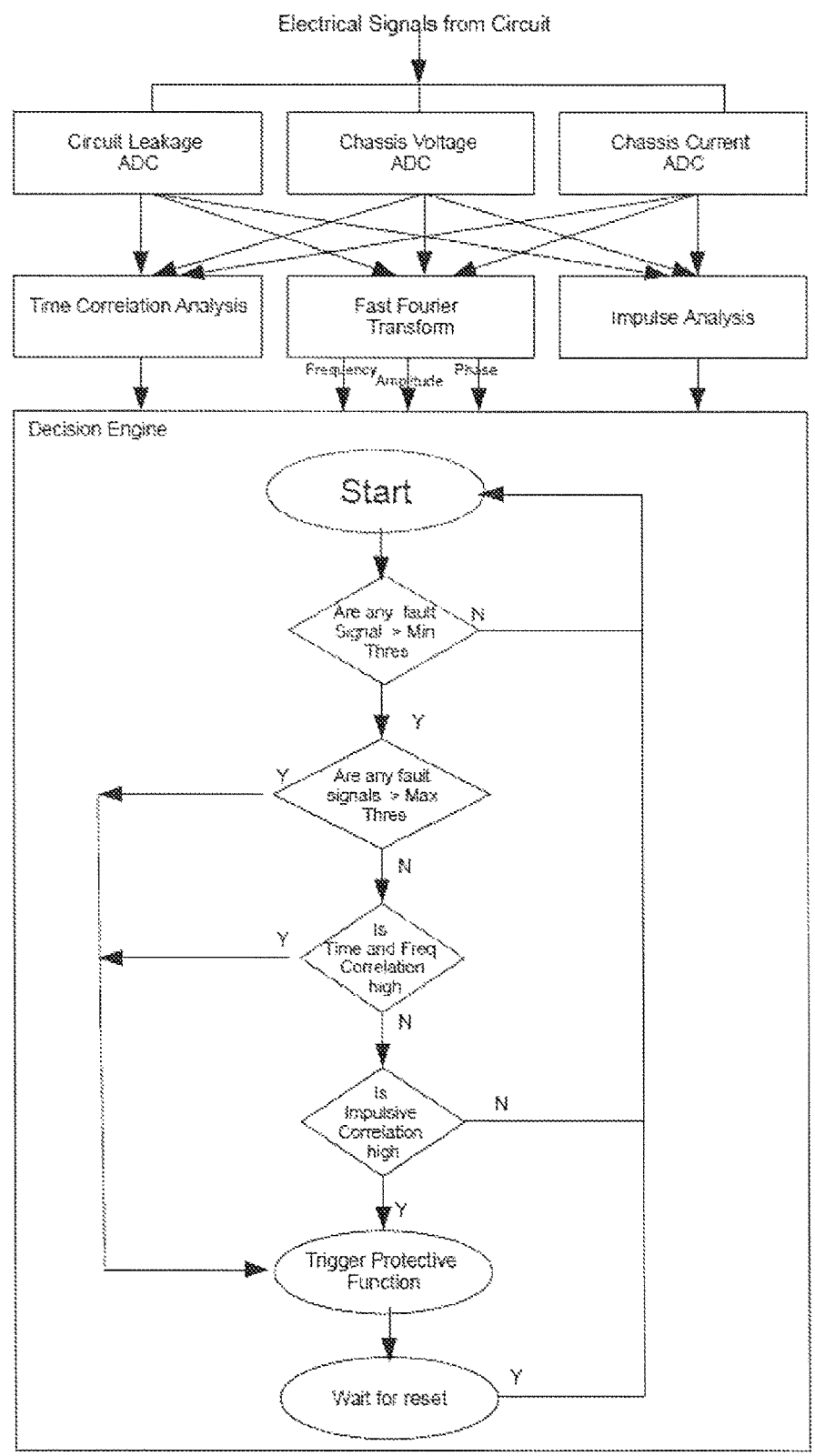
FIG. 5 is a flow chart diagram illustrating the logic process deployed within a microprocessor shown in FIGS. 2, 3 and 4.

FIG. 5 provides a flow diagram of the logic that might typically be deployed within the embodiment of FIG. 4. It is emphasised that the embodiments of FIGS. 2 and 3 would function similarly. However, the embodiment of FIG. 2 would not include a Chassis Current ADC input and the embodiment of FIG. 3 would not include a Chassis Voltage ADC input. As indicated within the flow chart of FIG. 5, the sensory inputs (for circuit leakage, chassis voltage and chassis current) are separately converted to digital signals within the integral ADC's of microprocessor 20 and these digital streams are thereafter processed using time correlation, fast Fourier transform (FFT) and impulse analysis functions.

As an example these processing functions might look for the following characteristics within the inputs:
(1) Peak amplitudes of each of the sensory inputs in both time and frequency spectrums which can be compared with thresholds levels within the decision engine.
(2) Time correlation between sensory inputs which would indicate whether or not residual current loss (current leakage) is being seen on the chassis of the equipment.

(3) Frequency correlations between the sensory inputs which thus allowing noise and 3$^{rd}$ party power sources to be separated from faults related to the controlled supply.

(4) Phase correlation (change) between sensory inputs which indicate the reactive component of the fault impedance including if the fault is purely resistive indicating an insulation failure of personnel risk.

(5) Voltage and current correlations between the chassis voltage and current sensory inputs that provides information on the fault impedance.

Within FIG. 5, the outputs of the time correlation, FFT and impulse analysis are input to the decision engine. Following is a description of the decision engine algorithm:

(1) The first stage of processing within the decision engine considers if any of the sensory inputs are above a minimum threshold to be somewhat indicative of a fault. For example, in one embodiment the minimum sensor threshold is set at 5 mA for RCD leakage current (where typically 30 mA is used as the threshold for RCD technology), 2.5 mA for chassis current (where typically the prior art suggests 5 mA as the threshold) and 20V for chassis voltage (where typically the prior art suggests something less than 40V). If any of these sensor inputs are exceeded then the decision engine continues to process. If none are exceeded the engine loops back and continues to check for a signal of minimum threshold.

(2) If one of the sensory inputs exceeds minimum threshold the decision engine then checks if any exceed a maximum threshold. For example, in one embodiment the maximum threshold is set at 30 mA for RCD leakage current, 20 mA for chassis current and 40V for chassis voltage. If any sensory inputs do exceed their respective maximum threshold, then protective action in the form of a fault signal will be triggered electrically isolate the load from the power source.

(3) In the absence of any one sensory input exceeding maximum threshold, the correlation characteristics of the inputs are checked for clear indications of an equipment fault or safety issue. This is carried out by checking if two signals are occurring closely correlated in time (therefore are not deemed to be noise) and if the impulse nature of the signals is similar. If there is any order to the signal, this would suggest lightning effects and, therefore, it would be a prudent delay to further processing. The frequencies of the different minimum signals are also checked that they correlate well and the phase makes sense given the likely fault scenarios possibly. If this additional analysis supports a decision to take protective action, then the protective action is triggered. This process is done in multiple decision steps. Within the flow chart two decision steps are described. However, it is appreciated that many other embodiments exist with other numbers and types of decision steps.

(4) If protective action is triggered, the system is placed in a wait state for outside reset. If no protective action is initiated then the system will return to the start and begin checking threshold levels again.

A further key aspect of device 1 is understanding the characteristics of key faults (such as knowing that the human body is predominantly resistive). This understanding creates the ability within device 1 to correlate the phase of the RCD leakage signal with that of the voltage sensing signal and exclude nuisance signals which might otherwise cause a protective function on any of the RCD, current sensing or voltage sensing sub-systems. Phase difference between the leakage and protective earth signals may indicate capacitive or induction-caused leakage rather than safety related resistive (human body) earth leakage. As a result, the combined technology is able to be optimized for sensitivity to events where the sense signals are in phase and less sensitive when they are not.

Device 1 is housed in a single standardised housing further enhancing the retrofitting of device 1 within an existing switchboard or other location within an electrical distribution system, while offering users with a familiar form factor.

It is also emphasised that device 1 uses a single microprocessor 20 that is responsible for all decisions including being an input to 'raw' information from the monitored circuit, collating information data from the monitored circuit and the activation of switches. It is appreciated by those skilled in the art that the more than one microprocessor is used in others embodiments where such an applicant is more suited to multiple microprocessors.

Further examples of significant performance advantages available by integrating the decision process of RCD technology with the voltage sensing technology include:

Improved identification of lighting and power system surge currents, which due to the action of surge protection, generate large voltage sensing signals (lighting impulse voltages as sensed by voltage sensing sub-system, out of time with subsequent ground leakage current. The time separation of such events allows the effective differentiation of such events from safety related faults and as such decreases false tripping.

The ability to adapt to aging earthing arrangements to optimize the protective function. When especially TT earthing systems age (but in some form all earthing arrangements), ground connections deteriorate and go high resistance. In early life, when connections and earth arrangements are new and optimal, all earthed systems respond best to RCD style protection. During the aging process RCD leakage signals become weak (due to the increasing aging earthing and bonding arrangements and the effects of poorly implemented upgrades and add-on works) and higher earth resistance voltage sensing protection may start to predominate as the most effective form of protection. The integration of both forms of protection into the one decision matrix allows the technology to self optimize over the life and provide the maximum protective function.

Improved tolerance to noise as a result of the ability to correlate the frequency of leakage current RCD signals against the frequency of protective metal work voltages (the voltage sensing signals), separating such signals which when simply considered from a magnitude perspective would precipitate a protective reaction. By allowing their separation and separate consideration the interference generated by the normal circuit operation of switch mode power supplies, frequency converters, solar inverters is eliminated or ameliorated.

None of these capabilities or benefits are available in existing standalone RCD, voltage or current sensing technologies and nor is it gained by the simple combination of the two. To gain the benefit of the embodiment there is a need to affect the required integration between the functions.

A surprising and unexpected further benefit of integrating the two technologies is cost—a critical aspect to wide market uptake. More particularly, modern RCD technology is predominantly implemented with special purpose, mainly analogue ICs. Many major semiconductor companies manufacture these IC's including Fairchild, ROHM, TI, and Mitsubishi. They have a common method of operation including simply low pass filtering, voltage comparison and a delay latch to remove false triggering caused by surge events.

Recently there has been a move to purpose built digital (with limited mixed signal) IC's. Related research has been documented in peer reviewed engineering journals.

The chassis voltage sensing and current sensing technology mentioned above is new and, as yet has not been integrated. The technology presented in Australian provisional patent application No. 2012903629 is analogue discrete with a microcontroller implementing fault tolerance functionality. The integration of the two technologies as separate functions results in costs being the simple sum of the two sensing devices. This added (approximately doubled) cost has the potential to considerable restrict market penetration.

The integrated decision making requirement of the present embodiment requires the use of a single central microcontroller (microprocessor). The low frequency of operation (50 Hz digital signal processing with millisecond response times) allows the very simple cheap microcontrollers used ubiquitously throughout domestic and industrial applications for equipment control to be applied to the purpose. These devices are mass-produced for a range of applications. They are reliable, relatively powerful, well documented and inexpensive. These devices include relatively powerful analogue to digital on-board conversion. As a result simple interfaces can be designed to facilitate the required voltage sensing, current sensing and RCD sensing as shown in the embodiments of FIGS. 2, 3 and 4.

Such microcontrollers now permit an operational RCD/voltage sensing circuit to be designed (such as that of FIG. 2) that is considerably less expensive than the combined cost of separate RCD and voltage sensing solutions, and only slightly more costly than RCD circuits alone.

The devices herein described are significantly advantageous over the prior art, where the functionality of the technology remains independent and separable in monitoring their fault signals and when either threshold is reached, then the protective function will be activated. The present devices, however, have a capability that spans a wider range of power system configurations and levels of degradation, from earthed-neutral (TN) where the RCD system operates, to floating power configurations (IT) where chassis sensing systems work, from new installations to aging and poorly maintained installations. This invention is intended to remedy this unsafe situation as an example of many such scenarios where the present state of the art is insufficient.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term connected, when used in the claims, should not be interpreted as being limited to direct connections or couplings only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" or "connected" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as falling within the scope of the invention. Functionality may be added or deleted from the block diagrams and operations may be interchanged among functional blocks.

The invention claimed is:
1. An electrical protection device including:
   at least two input terminals for electrically connecting respectively to an active conductor and a neutral conductor of an electrical power source that is upstream of the electrical protection device;
   at least two output terminals for electrically connecting to a load having a conductive chassis that is downstream of the protection device, the load drawing a load current;
   a first sensor for providing a first signal derived from the load current;
   a second sensor for providing a second signal derived from a voltage differential between the conductive chassis and a voltage reference;
   a processing unit that is responsive to the first and second signals for selectively generating a fault signal, wherein the processing unit includes a processor that executes a predetermined algorithm which is responsive to the first and second signals for selectively generating the fault signal; and
   a switching unit that is responsive to the fault signal for progressing from a first state to a second state,
   wherein, in the first state, one or more of the at least two input terminals are electrically connected to one or more of the at least two output terminals to allow the load current to be drawn from the electrical power source to the load, and
   wherein, in the second state, one or more of the at least two input terminals are electrically isolated from one or more of the at least two output terminals and prevent the load current being drawn from the electrical power source to the load.

2. An electrical protection device according to claim 1, wherein the predetermined algorithm is responsive to:
   the first and second signals for calculating one or more secondary indications; and
   the one or more secondary indications for selectively generating the fault signal.

3. An electrical protection device according to claim 1, wherein the processing unit includes memory and the processor selectively stores data in the memory for use in later calculating one or more secondary indications.

4. An electrical protection device according to claim 1, wherein the load has a leakage current and the first signal is indicative of the leakage current.

5. An electrical protection device according to claim 1, wherein the second signal derived from a current flowing from the chassis to a current sink.

6. An electrical protection device according to claim 5, wherein the current sink is earth.

7. An electrical protection device according to claim 5, wherein the current sink is the neutral conductor.

8. An electrical protection device according to claim 1, wherein the voltage reference is earth.

9. An electrical protection device according to claim 1, wherein the voltage reference is the neutral conductor.

10. An electrical protection device according to claim 1, wherein the fault signal is generated in response to the first signal meeting a first fault condition.

11. An electrical protection device according to claim 10, wherein the first fault condition is the load current exceeding a predetermined first threshold.

12. An electrical protection device according to claim 11, wherein the processing unit will selectively generate the fault signal based on an assessment of one or more characteristics of the second signal.

13. An electrical protection device according to claim 1, wherein the fault signal is generated in response to the second signal meeting a second fault condition.

14. An electrical protection device according to claim 13 wherein the processing unit will selectively generate the fault signal based on an assessment of one or more characteristics of the first signal.

15. An electrical protection device including:
at least two input terminals for electrically connecting respectively to an active conductor and a neutral conductor of an electrical power source that is upstream of the protection device;
at least two output terminals for electrically connecting to a load having a conductive chassis, the load being downstream of the electrical protection device and drawing a load current at a load voltage;
a first sensor for providing a first signal derived from the load current;
a second sensor for providing a second signal derived from a voltage differential between the conductive chassis and a voltage reference;
a third sensor for providing a third signal derived from a current in the conductive chassis;
a processing unit that is responsive to the first, second, and third signals for selectively generating a fault signal, wherein the processing unit includes a processor that executes a predetermined algorithm which is responsive to at least the first and second signals for selectively generating the fault signal; and
a switching unit that is responsive to the fault signal for progressing from a first state to a second state,
wherein, in the first state, one or more of the at least two input terminals are electrically connected to one or more of the at least two output terminals to allow the load current to be drawn from the electrical power source to the load, and
wherein, in the second state, one or more of the at least two input terminals are electrically isolated from one or more of the of the at least two output terminals and prevent the load current being drawn from the electrical power source to the load.

16. An electrical protection device including:
at least two input terminals for electrically connecting respectively to an active conductor and a neutral conductor of an electrical power source that is upstream of the protection device;
at least two output terminals for electrically connecting to a load having a conductive chassis, the load being downstream of the electrical protection device and drawing a load current at a load voltage;
a first sensor for providing a first signal derived from the load current;
a second sensor for providing a second signal derived from a current in the conductive chassis;
a processing unit that is responsive to the first and second signals for selectively generating a fault signal, wherein the processing unit includes a processor that executes a predetermined algorithm which is responsive to the first and second signals for selectively generating the fault signal; and
a switching unit that is responsive to the fault signal for progressing from a first state to a second state,
wherein, in the first state, one or more of the at least two input terminals are electrically connected to one or more of the at least two output terminals to allow the load current to be drawn from the electrical power source to the load, and
wherein, in the second state, one or more of the at least two input terminals are electrically isolated from one or more of the at least two output terminals and prevent the load current being drawn from the electrical power source to the load.

* * * * *